United States Patent
Arai et al.

(10) Patent No.: US 7,989,227 B2
(45) Date of Patent: Aug. 2, 2011

(54) METHOD OF MANUFACTURING SEMICONDUCTOR CHIP AND SEMICONDUCTOR MODULE

(75) Inventors: Kiyoshi Arai, Chiyoda-ku (JP); Majumdar Gourab, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 237 days.

(21) Appl. No.: 12/479,248

(22) Filed: Jun. 5, 2009

(65) Prior Publication Data
US 2010/0075444 A1    Mar. 25, 2010

(30) Foreign Application Priority Data
Sep. 23, 2008   (JP) ................... 2008-243438

(51) Int. Cl.
*H01L 21/00*   (2006.01)
(52) U.S. Cl. ................ 438/10; 438/14; 438/17
(58) Field of Classification Search ............ 438/10, 438/11, 14, 15, 17, 18; 324/762.03, 762.05, 324/762.09
See application file for complete search history.

(56) References Cited

U.S. PATENT DOCUMENTS

| 5,612,628 | A | * | 3/1997 | Nicollian et al. | ........ 324/762.09 |
| 5,650,335 | A | * | 7/1997 | Terazono | ................ 438/11 |
| 6,275,059 | B1 | * | 8/2001 | Sah et al. | ............... 324/762.05 |
| 6,476,443 | B1 | | 11/2002 | Kinzer | |
| 7,902,049 | B2 | * | 3/2011 | Guha et al. | .................... 438/485 |
| 2002/0036319 | A1 | | 3/2002 | Baliga | |
| 2004/0099905 | A1 | | 5/2004 | Baliga | |
| 2007/0018243 | A1 | | 1/2007 | Ono et al. | |
| 2007/0108515 | A1 | | 5/2007 | Hueting et al. | |
| 2007/0187695 | A1 | | 8/2007 | Nakamura et al. | |

FOREIGN PATENT DOCUMENTS

| JP | 2000-156503 | 6/2000 |
| JP | 2004-537162 | 12/2004 |
| JP | 2005-510880 | 4/2005 |
| JP | 2007-27266 | 2/2007 |
| JP | 2007-512701 | 5/2007 |
| JP | 2007-194283 | 8/2007 |

* cited by examiner

*Primary Examiner* — Kevin M Picardat
(74) *Attorney, Agent, or Firm* — Oblon, Spivak, McClelland, Maier & Neustadt, L.L.P.

(57) ABSTRACT

An FOM (figure of merit) enabling evaluation from a cost aspect, as well as evaluation of electrical performance, is newly proposed to provide a method of manufacturing based on the FOM a semiconductor chip intended for a lower cost production in addition to satisfying electrical performance. An $FOM_C$ of a semiconductor chip is defined as the product of a term represented by electrical performance of a substrate S and a term represented by a semiconductor chip cost $C_C$; the $FOM_C$ of each of the semiconductor chips on substrates $S_S$, $S_C$ of different type is determined by calculation of the product thereof. Based on the magnitudes of the calculation results, a desired substrate is selected from the substrates $S_S$, $S_C$ and then a semiconductor chip is fabricated by forming a semiconductor element on the desired substrate selected.

6 Claims, 1 Drawing Sheet

| App | S ($S_S$, $S_C$) | Jc | $V_F$ | $e_π$ | $C_C$ | $FOM_C$ | $C_M$ | $FOM_M$ |
|---|---|---|---|---|---|---|---|---|
| Use/Application | Substrate | Rated current density | On-state power loss (DC loss) | Switching loss | Manufacturing cost of semiconductor chip | FOM of semiconductor chip | Manufacturing cost of semiconductor module | FOM of semiconductor module |
| Inverter | Silicon (Si) | 200 | 1 | 1 | 1 | 200 | 3 | 67 |
| | Silicon carbide (SiC) | 1000 | 0.8 | 0.1 | 100 | 125 | 102 | 123 |
| | | | | | 10 | 1250 | 12 | 1042 |
| | | | | | 5 | 2500 | 7 | 1786 |
| | | | | | 1 | 12500 | 3 | 4167 |

FIG. 1

| App | S (Ss, Sc) | Jc | Vf | err | Cc | FOMc | Cm | FOMm |
|---|---|---|---|---|---|---|---|---|
| Use/Application | Substrate | Rated current density | On-state power loss (DC loss) | Switching loss | Manufacturing cost of semiconductor chip | FOM of semiconductor chip | Manufacturing cost of semiconductor module | FOM of semiconductor module |
| Inverter | Silicon (Si) | 200 | 1 | 1 | 1 | 200 | 3 | 67 |
| | Silicon carbide (SiC) | 1000 | 0.8 | 0.1 | 100 | 125 | 102 | 123 |
| | | | | | 10 | 1250 | 12 | 1042 |
| | | | | | 5 | 2500 | 7 | 1786 |
| | | | | | 1 | 12500 | 3 | 4167 |

METHOD OF MANUFACTURING SEMICONDUCTOR CHIP AND SEMICONDUCTOR MODULE

FIELD OF THE INVENTION

The present invention relates to methods of manufacturing semiconductor chips and semiconductor modules.

BACKGROUND OF THE INVENTION

A performance index called an FOM (figure of merit) is employed to determine the performance of a semiconductor chip or a semiconductor module having a plurality of semiconductor chips therein.

The FOM is represented by an equation incorporating electrical characteristics of on-resistance, charge density, and the like in order to determine the electrical performance of a semiconductor chip or a semiconductor module. By using a value of an FOM gained by substituting a specific value of the electrical characteristic into the FOM equation, individual performance of the semiconductor chip or the semiconductor module is determined, or performance of one chip/module is compared with that of another semiconductor chip/module.

For instance, Japanese Unexamined Patent Publication No. 2000-156503 (paragraph 0006) discloses that an FOM of an MOSFET (metal oxide semiconductor field effect transistor) is defined as the product of a charge $Q_{GD}$ and an on-resistance $R_{DSON}$.

Further, Japanese Unexamined Patent Publication (Translation of PCT Application) No. 2004-537162 (paragraph 0005) discloses that an FOM of an MOSFET is defined with a specific on-resistance ($R_{on,\ sp}$) associated with a blocking voltage.

Still further, Japanese Unexamined Patent Publication No. 2007-27266 (paragraph 0013) discloses that an FOM of an MOSFET is defined as the product of an on-resistance $R_{on}$ and a gate-drain capacitance $Q_{gd}$.

Yet still further, Japanese Unexamined Patent Publication (Translation of PCT Application) No. 2007-512701 (paragraph 0003) discloses that an FOM of an trench MOSFET is defined with an on-resistance ($R_{ds,\ on}$) associated with a gate-drain charge density ($Q_{gd}$).

In this way, the FOM is used as an index for determining the electrical performance of a semiconductor chip or a semiconductor module. However, even though the semiconductor chip or semiconductor module that satisfies desired performance is designed and manufactured based upon the FOM, such production process does not necessarily result in commercially successful products. For instance, even if desired performance is satisfied, a manufacturing cost of semiconductor chip/module may in fact rise. In this way, the FOM can be used to determine performance of the semiconductor chip or the semiconductor module, but cannot be used as commercial criteria.

SUMMARY OF THE INVENTION

The present invention is directed to overcome foregoing problems, and an object thereof is to newly propose an FOM that allows determination from a cost aspect in addition to determination of electrical performance and to provide a method of manufacturing, based on the FOM, a semiconductor chip and a semiconductor module at lower cost in addition to satisfying electrical performance.

A method of manufacturing a semiconductor chip according to the present invention comprises a comparison step that calculates, based on an equation of an FOM (figure of merit) of a semiconductor chip defined as the product of a term represented by electrical performance of a substrate and a term represented by a manufacturing cost of a semiconductor chip, FOMs of semiconductor chips on substrates of different type, to thereby compare magnitudes of calculation based on the calculation results through the comparison step; and an element formation step that forms a semiconductor element on the desired substrate selected in the selection step.

Furthermore, a method of manufacturing a semiconductor module according to the present invention comprises a comparison step that calculates, based on an equation of an FOM (figure of merit) of a semiconductor chip defined as the product of a term represented by electrical performance of a substrate and a term represented by a manufacturing cost of a semiconductor module, FOMs of semiconductor modules on substrates of different type, to thereby compare magnitudes of calculation results; a selection step that selects a desired substrate based on the magnitudes of the calculation results through the comparison step; an element formation step that forms a semiconductor element on the desired substrate selected in the selection step; and a packaging step that interconnects a plurality of semiconductor chips fabricated in the element formation step, to house the plurality thereof in a package.

According to the present invention, there is provided a method of manufacturing a semiconductor chip intended for a lower cost production, in addition to satisfying electrical performance.

The present invention further provides, in addition to satisfying electrical performance, a method of manufacturing a semiconductor module intended for a lower cost production, based on the foregoing FOM of the semiconductor chip,

BRIEF DESCRIPTION OF THE DRAWING

FIG. 1 is a table for illustrating an example of results of applying to an inverter FOMs of a semiconductor chip and a semiconductor module according to an embodiment of the present invention.

DESCRIPTION OF THE PREFERRED EMBODIMENT

To start with, an FOM according to the present invention is shown as Equation 1.

$$\text{FOM} = J_C / (V_F \times e_{rr} \times C) \qquad \text{Equation 1}$$

where $J_C$ represents a rated current density (A/cm$^2$); $V_F$, an on-state power loss (DC power loss); and $e_{rr}$, a switching loss, with each symbol showing an electrical characteristic and C also denoting a manufacturing cost of semiconductor chip $C_C$ or the manufacturing cost of a semiconductor module $C_M$. As is evident from Equation 1, the FOM is defined as the product of a term $J_C/(V_F \times e_{rr} \times C)$ represented by electrical performance and a term 1/C represented by either of the costs.

FIG. 1 shows an example of a result of applying to an inverter the FOB shown in Equation 1.

Referring to FIG. 1 (table), a column labeled App shows an application, i.e., an objective product, where is assumed an inverter; a type of a substrate labeled S is shown which is applied to the applicable product, where a silicone (Si) substrate $S_S$ and a silicon carbide (SiC) substrate $S_C$ are applied. The silicon substrate used is one that is commercially widely available, whereas the silicon carbide substrate is one that is expected as the next generation one. The FOM shown in Equation 1 is highly useful in selecting any one of such substrate materials. A column labeled $J_C$ represents a rated current density (A/cm²) of one of the electrical characteristics. A column labeled $V_F$ represents an on-state power loss of one of the electrical characteristics, which is a DC loss. A column labeled $e_{rr}$ represents a switching loss of one of the electrical characteristics. A column labeled $C_C$ represents a cost of manufacturing a semiconductor chip C (hereinafter called semiconductor chip cost $C_C$). A column labeled $FOM_C$ represents an FOM of a semiconductor chip. Likewise, a column labeled $C_M$ represents a cost of manufacturing the semiconductor-chips-mounting semiconductor module (hereinafter called semiconductor module cost $C_M$). Further, a column labeled $FOM_M$ shows an FOM of the semiconductor module.

The rated current density $J_C$ is shown in an absolute value. Typically, the rated current density $J_C$ of the silicon substrate $S_S$ is 200 to 250 A/cm², while the density $J_C$ of the silicon carbide substrate $S_C$ is 300 to 1,000 A/cm². In FIG. 1, the density $J_C$ of the silicon substrate $S_S$ is set to 200 A/cm², while the density $J_C$ of the silicon carbide substrate $S_C$ is set to 1,000 A/cm².

The on-state power loss $V_F$ is shown in a relative value, and here the on-state power loss $V_F$ of the silicon substrate $S_S$ is designated as one (1). At that time, the loss $V_F$ of the silicon carbide substrate $S_C$ is between 0.6 and 0.8. In FIG. 1, the loss $V_F$ of the substrate $S_C$ is set to 0.8.

The switching loss $e_{rr}$ is shown in a relative value and here, the loss $e_{rr}$ of the silicon substrate $S_S$ is designated as one (1). At that time, the loss $e_{rr}$ of the silicon carbide substrate $S_C$ is between 0.1 and 0.3. In FIG. 1, the loss $e_{rr}$ of the substrate $S_C$ is set to 0.1.

The semiconductor chip cost $C_C$ is shown in a relative value and here, the semiconductor chip cost $C_C$ of the silicon substrate $S_S$ is designated as one (1). At that time, the chip cost $C_C$ of the substrate $S_C$ is between 100 and 1. In FIG. 1, the chip cost $C_C$ of the substrate $S_C$ is shown as 100, 10, 5 and 1, which are, as a matter of fact, consecutively varying values. Here, a value of 100, which is the chip cost $C_C$ of the substrate $S_C$ shows that the semiconductor chip cost is 100 times higher than the chip cost $C_C$ of the substrate $S_S$. And a value of one (1), which is the semiconductor chip cost $C_C$ of the substrate $S_C$, shows that the semiconductor chip cost is equal to the chip cost $C_C$ of the substrate $S_S$. Reduction in the chip cost $C_C$ of the substrate $S_C$ can be achieved by, for instance, cost reduction in material procurement and/or cost reduction in manufacture owing to progress in semiconductor manufacturing technology.

The $FOM_C$ of the semiconductor chip is a value calculated by substituting to Equation 1 values of the rated current density $J_C$, the on-state power loss $V_F$, the switching loss err, and the semiconductor chip cost $C_C$, in the silicon substrate $S_S$ and the silicon carbide substrate $S_S$.

The semiconductor module cost $C_M$ is a value of adding two (2) to the semiconductor chip cost $C_C$. Semiconductor modules are typically manufactured by having semiconductor chips mounted on a semiconductor substrate and then packaging the chips. For that reason, the semiconductor module cost $C_M$ is such that the proportion of a cost involved in manufacturing the semiconductor module is added to the chip cost $C_C$. Here, the module cost $C_M$ of the silicon substrate $S_S$ is shown as a value of three, which is obtained by adding a value of two to the chip cost $C_C$; the module cost $C_M$ of the silicon carbide substrate $S_C$, which is obtained by adding a value of 2 to the chip cost $C_C$, falls within a range of 102 to 3. FIG. 1 shows the semiconductor module cost $C_M$ of the substrate $S_C$ as values of 102, 12, 7 and 3; however, actually, such values are consecutively varying ones. Reduction in the module cost $C_M$ thereof can be achieved by, for instance, cost reduction in material procurement and/or cost reduction in manufacture owing to progress in manufacturing technology.

The $FOM_M$ of the semiconductor module is a value calculated by substituting into Equation 1 values of the rated current density $J_C$, the on-state power loss $V_F$, the switching loss $e_{rr}$, and the semiconductor module cost $C_M$, in the silicon substrate $S_S$ and the silicon carbide substrate $S_C$.

The $FOM_C$ of the semiconductor chip and the $FOM_M$ of the semiconductor module, shown in FIG. 1, will be used as described below.

First, the $FOM_C$ of the semiconductor chip will be described. The $FOM_C$ of the semiconductor chip whose value is greater is advantageous, that is, the greater value of the $FOM_C$ thereof, as well as satisfying the performance, allows lower cost products to be placed on the market, thus leading to improvement of their price competitiveness, which provides a commercial advantage.

Referring to FIG. 1, the $FOM_C$ of the semiconductor chip of using the silicon substrate $S_S$ is 2,000, whereas the $FOM_C$ of using the silicon carbide substrate $S_C$, first when the semiconductor chip cost $C_C$ is 100, amounts to 125, which is smaller than a value of 200, the FOM of the chip of using the substrate $S_S$. Thus, in this case, the use of the silicon substrate $S_S$ as the substrate S allows semiconductor chips to be manufactured at lower cost. Next, when the semiconductor chip cost $C_C$ of the silicon carbide substrate $S_S$ is a value of 10, the $FOM_C$ of the semiconductor chip is a value of 1250, which is larger than a value of 200, the $FOM_C$ of the semiconductor chip when using the silicon substrate $S_S$; thus, in this case, the use of the silicon carbide substrate $S_C$ as the substrate S allows lower-cost manufacture of semiconductor chips. Likewise, when the manufacture costs of the semiconductor chip $C_C$ of the silicon carbide substrate $S_S$ are values of 5 and 1 as well, the use of the silicon carbide substrate $S_C$ permits the semiconductor chip to be manufactured at lower cost. Here, when the semiconductor chip cost $C_C$ is a value of 62.5 in using the silicon carbide substrate $S_C$, the $FOM_C$ of the semiconductor chip is a value of 200, which is the same as the $FOM_C$ of the semiconductor chip in using the silicon substrate $S_S$. Consequently, the value of 62.5, which is the semiconductor chip cost $C_C$ of using the silicon carbide substrate $S_C$, is a criterion value for choosing the desired substrate when using the silicon substrate $S_S$ and the silicon carbide substrate $S_C$.

In the actual manufacture, such values can be used for selecting a type of the substrate S to be applied for the manufacture of semiconductor chips. For instance, given that if any of the silicon substrate $S_S$ and the silicon carbide substrate $S_C$ is used and semiconductor chips satisfying predetermined performance can be provided, then the use of the substrate, whichever is more economical for the manufacture, allows reduction of the semiconductor chip cost. In this case, lower-cost semiconductor chips can be provided if comparison is made between the $FOM_C$ of the semiconductor chip of using the silicon substrate $S_S$ and that of using the silicon carbide substrate $S_C$, and then, semiconductor chips are manufactured using, as a preferable substrate S, that of the semiconductor chip having a greater $FOM_C$. Consequently, if the semiconductor chips are manufactured by the semiconductor-chip process that includes a comparison step through which comparison is made between the $FOM_C$ of the semiconductor chip of using the silicon substrate $S_S$ and that of using the silicon carbide substrate $S_C$, a selection step that selects through the comparison step the substrate S having a greater $FOM_C$, as a desired substrate $S_S$, and an element formation step that forms, on the substrate S selected through the selection step, a semiconductor element, for instance, a diode element or a semiconductor element such as diode, MOSFET and IGBT (insulated gate bi-polar transistor), then it is possible to provide lower-cost semiconductor chips in addition to performance satisfaction being achieved, which leads to enhancement of market price competitiveness, resulting in such chips being commercially advantageous.

Next, an $FOM_M$ of a semiconductor module will be described. The $FOM_M$ in the semiconductor module whose value is greater is advantageous, as with that of the $FOM_C$ in the semiconductor chip. That is, a greater value of the $FOM_M$ in the semiconductor module allows, as well as satisfying its performance, lower cost products to be introduced on the market, thus leading to enhancement of their market price competitiveness and resulting in such chips being commercially advantageous.

Referring to FIG. 1, the $FOM_M$ of the semiconductor module of using the silicon substrate $S_S$ is 67, whereas when the semiconductor module cost $C_M$ is 102, the $FOM_M$ of using the silicon carbide substrate $S_C$ amounts to 123. This value is greater than a value of 67, which is the $FOM_M$ of the semiconductor module of using the silicon substrate $S_S$. Thus, the use of the silicon substrate $S_C$ as the substrate S allows the semiconductor module to be manufactured at lower cost. Likewise, when the semiconductor module cost $C_M$ of the silicon carbide substrate $S_C$ is values of 12, 7 and 3 as well, the use of the silicon carbide substrate $S_C$ permits the semiconductor module to be manufactured at lower cost. Here, when the semiconductor module cost $C_M$ in using the silicon carbide substrate $S_C$ is a value of 186.57, the $FOM_C$ of the semiconductor chip is substantially the same as the $FOM_C$ of the semiconductor module in using the silicon substrate $S_S$. Consequently, the module cost $C_M$—the value of 186.57—in using the substrate $S_C$ is a criterion value of using the silicon substrate $S_S$ or the silicon carbide substrate $S_C$. Here, when the module cost $C_M$ of using the substrate $S_C$ is a value of 186.57, the chip cost $C_C$ is 184.57; thus, when manufacturing semiconductor modules, the chip cost $C_C$ is allowed to take a value up until approximately 184.57.

In the actual manufacture, the criterion value can be used for selecting a type of the substrate S to be applied for manufacture of semiconductor modules. For instance, given that if any of the silicon substrate $S_S$ and the silicon carbide substrate $S_C$ is used and semiconductor modules satisfying predetermined performance can be provided, then the use of the substrate, whichever is more economical for the manufacture, allows the semiconductor module cost to be reduced. In this case, lower-cost semiconductor modules can be provided if comparison is made between the $FOM_M$ of the semiconductor module of using the silicon substrate $S_S$ and that of using the silicon carbide substrate $S_C$ and then, semiconductor modules are manufactured using, as a desired substrate S, that of the semiconductor module with a greater $FOM_M$. Consequently, lower-cost semiconductor modules can be provided in addition to performance satisfaction being achieved, if the semiconductor-module process includes a comparison step through which comparison is made between the $FOM_M$ of the semiconductor module of using the silicon substrate $S_S$ and that of using the silicon carbide substrate $S_C$, and a selection step that selects through the comparison step the substrate S with a greater $FOM_M$, as a desired substrate S, and if semiconductor chips are manufactured by forming a semiconductor element, such as diode, MOSFET, and IGBT, on the substrate S selected through the selection step, and also if a semiconductor module is manufactured using a packaging step that mounts and interconnects a plurality of semiconductor chips achieved by way of the element formation step, to then house the plurality thereof in a package. Thus, this manufacturing process leads to enhancement of market price competitiveness, resulting in such modules being commercially advantageous.

Note that while the present embodiment is described using the example of the inverter as the objective product, it should be understood of course that the present invention is not limited to the inverter but applicable to other products such as a converter, a PFC (power factor control) circuit, and a brake circuit as well.

Note again that although the present embodiment is described using an example of the silicon substrate $S_S$ or the silicon carbide substrate $S_C$, it should be understood of course that the present invention is not limited to such substrate but is applicable to every possible substrate.

Note further that although the present embodiment is described using specific values for the rated current density $J_C$, the on-state power loss $V_F$ and the switching loss $e_{rr}$, representing electrical characteristics, such values are not fixed values but those having a predetermined range and it should be understood of course that they may be selected as appropriate from within the predetermined range.

What is claimed is:

1. A method of manufacturing a semiconductor chip, comprising:
   a comparison step that calculates, based on an equation of an FOM (figure of merit) of a semiconductor chip defined as a product of a term represented by electrical performance of a substrate and a term represented by a manufacturing cost of a semiconductor chip, FOMs of semiconductor chips on substrates of different type, to thereby compare magnitudes of calculation results;
   a selection step that selects a desired substrate from the substrates of different type, based on the magnitudes of the calculation results through the comparison step; and
   an element formation step that forms a semiconductor element on the desired substrate selected in the selection step.

2. The method of manufacturing a semiconductor chip of claim 1, wherein the term represented by electrical performance is designated as $J_C/(V_F \times e_{rr})$ when a rated current density is designated as $J_C$, an on-state power loss as $V_F$, and a switching loss as $e_{rr}$, the term represented by the manufacturing cost of semiconductor chip is designated as $1/C$ when the cost thereof is designated as $C$, and the desired substrate is a substrate having the greater calculation result of the FOM in the substrates of the different type.

3. The method of manufacturing a semiconductor chip of claim 2, wherein the substrates of the different type are a silicon substrate and a silicon carbide substrate.

4. A method of manufacturing a semiconductor module, comprising:
   a comparison step that calculates, based on an equation of an FOM (figure of merit) of a semiconductor module defined as a product of a term represented by electrical performance of a substrate and a term represented by a manufacturing cost of a semiconductor chip, FOMs of semiconductor modules on substrates of different type, to thereby compare magnitudes of calculation results;
   a selection step that selects a desired substrate based on the magnitudes of the calculation results through the comparison step;
   an element formation step that forms a semiconductor element on the desired substrate selected in the selection step; and
   a packaging step that interconnects a plurality of semiconductor chips fabricated in the element formation step, to house the plurality thereof in a package.

5. The method of manufacturing a semiconductor module of claim 4, wherein the term represented by electrical performance is represented as $J_C/(V_F \times e_{rr})$ when a rated current density is designated as $J_C$, an on-state power loss as $V_F$, and a switching loss as $e_{rr}$, the term represented by the manufacturing cost semiconductor module is represented as $1/C$ when the cost thereof is designated as C, and the desired substrate is a substrate having the greater calculation result of the FOM in the substrates of the different type.

6. The method of manufacturing a semiconductor module of claim 5, wherein the substrates of the different type are a silicon substrate and a silicon carbide substrate.

* * * * *